US010693503B2

(12) United States Patent
Shin et al.

(10) Patent No.: US 10,693,503 B2
(45) Date of Patent: Jun. 23, 2020

(54) POLAR CODE DECODING APPARATUS AND METHOD

(71) Applicant: SAMSUNG ELECTRONICS CO., LTD., Suwon-si (KR)

(72) Inventors: Dong-Min Shin, Seoul (KR); Min Uk Kim, Hwaseong-si (KR); Ki Jun Lee, Seoul (KR); Jun Jin Kong, Yongin-si (KR); Hong Rak Son, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

(21) Appl. No.: 16/013,053

(22) Filed: Jun. 20, 2018

(65) Prior Publication Data

US 2019/0140665 A1    May 9, 2019

(30) Foreign Application Priority Data

Nov. 6, 2017  (KR) .................. 10-2017-0146674

(51) Int. Cl.
*H03M 13/29* (2006.01)
*H03M 13/13* (2006.01)
*H03M 13/27* (2006.01)
*H03M 13/09* (2006.01)
*H03M 13/00* (2006.01)
*H03M 13/15* (2006.01)

(52) U.S. Cl.
CPC ....... *H03M 13/2906* (2013.01); *H03M 13/09* (2013.01); *H03M 13/13* (2013.01); *H03M 13/15* (2013.01); *H03M 13/27* (2013.01); *H03M 13/2792* (2013.01); *H03M 13/2927* (2013.01); *H03M 13/6362* (2013.01)

(58) Field of Classification Search
CPC .. H03M 13/2906; H03M 13/13; H03M 13/09; H03M 13/15; H03M 13/2792; H03M 13/6362; H03M 13/27; H03M 13/2927
USPC ........................................................ 714/755
See application file for complete search history.

(56) References Cited

U.S. PATENT DOCUMENTS

| 8,347,186 | B1 | 1/2013 | Arikan |
| 9,203,525 | B2 | 12/2015 | Shen et al. |
| 9,209,832 | B2 | 12/2015 | Alhussien et al. |

(Continued)

FOREIGN PATENT DOCUMENTS

WO    2017/156792 A1    9/2017

OTHER PUBLICATIONS

Hassani, et al., "Universal Polar Codes", Dec. 2013, Computer Science > Information Theory, pp. 1-10.

(Continued)

*Primary Examiner* — John J Tabone, Jr.
(74) *Attorney, Agent, or Firm* — Sughrue Mion, PLLC

(57) ABSTRACT

A polar code encoding and decoding method includes generating a first and second sub-codewords. The sub-codewords correspond to pre-codewords, and the pre-codewords have a shared data aspect. The sub-codewords provide useful error-recovery for data stored in a memory. When data is read from the memory, decoding takes place. The data read operation may include hard decision decoding, soft decision decoding, or hard decision decoding followed by soft decision decoding. In the method, the shared data aspect is used to decode a first sub-codeword for which decoding was not initially successful. An apparatus is also provided.

20 Claims, 10 Drawing Sheets

(56) References Cited

U.S. PATENT DOCUMENTS

| | | | |
|---|---|---|---|
| 9,362,956 B2 | 6/2016 | Mandavifar et al. | |
| 9,628,114 B2 | 4/2017 | Huang et al. | |
| 10,135,460 B2* | 11/2018 | Ionita | H03M 5/18 |
| 10,326,478 B2* | 6/2019 | Trifonov | H03M 13/3746 |
| 2014/0019820 A1* | 1/2014 | Vardy | H03M 13/13 |
| | | | 714/752 |
| 2015/0091742 A1* | 4/2015 | Ionita | H03M 5/18 |
| | | | 341/57 |
| 2015/0256196 A1 | 9/2015 | Alhussien et al. | |
| 2015/0295593 A1* | 10/2015 | Trifonov | H03M 13/3746 |
| | | | 714/776 |
| 2015/0333775 A1 | 11/2015 | Korb et al. | |
| 2015/0381208 A1 | 12/2015 | Li et al. | |
| 2018/0248567 A1* | 8/2018 | Qu | H03M 13/13 |
| 2018/0278369 A1* | 9/2018 | Ge | H03M 13/13 |
| 2018/0351579 A1* | 12/2018 | Hong | H03M 13/13 |
| 2018/0358985 A1* | 12/2018 | Kim | H03M 13/09 |
| 2018/0375615 A1* | 12/2018 | Xu | H04L 1/0054 |
| 2019/0036550 A1* | 1/2019 | Koike-Akino | H03M 13/13 |
| 2019/0044530 A1* | 2/2019 | Ionita | H03M 5/18 |
| 2019/0058548 A1* | 2/2019 | Wu | H04L 1/0058 |
| 2019/0238268 A1* | 8/2019 | Kim | H04B 7/0413 |

OTHER PUBLICATIONS

Anonymous, "Details of the Polar code design", 2016, Huawei, HiSilicon, 3GPP TSG RAN WG1 Meeting #87, R1-1611254, 20 pages total.

Anonymous, "Channel coding for control channels", 2016, Huawei, HiSilicon, 3GPP TSG RAN WG1 Meeting #86, R1-167216, 8 pages total.

Search Report dated Jan. 28, 2019, issued by the Intellectual Property Office of Singapore in counterpart Singaporean Patent Application No. 10201808008V.

Written Opinion dated Jan. 28, 2019, issued by the Intellectual Property Office of Singapore in counterpart Singaporean Patent Application No. 10201808008V.

* cited by examiner $$[G]_2 = \begin{bmatrix} 1 & 0 \\ 1 & 1 \end{bmatrix} \quad \begin{array}{l} u = [u_1 \ u_2] \\ c = [c_1 \ c_2] \\ c = uG_2 \end{array}$$

$$[G]_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix}$$

$$[G]_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix}$$

POLAR CODE DECODING APPARATUS AND METHOD

CROSS-REFERENCE TO THE RELATED APPLICATION

This application claims priority to Korean Patent Application No. 10-2017-0146674, filed on Nov. 6, 2017, and all the benefits accruing therefrom under 35 U.S.C. § 119, the disclosure of which is incorporated herein by reference in its entirety.

BACKGROUND

The present disclosure relates to a polar code decoding apparatus and method.

In a memory system, encoding and decoding are performed using low-density parity check (LDPC) codes or turbo codes. Recently, polar codes have attracted attention, and research has been vigorously conducted into efficient coding algorithms for improving complexity to achieve the excellent performance of polar codes.

Polar codes are highly notable not only because they can achieve as high a channel capacity as a discrete memoryless channel by using a successive cancellation decoding scheme, but also because their design and efficient encoding and decoding algorithms therefor are already suggested.

A discrete random channel is transformed into a set of channels with different reliabilities through channel polarization. If data is transmitted only through channels with a high reliability, the reliability of the entire system can be improved.

Channel polarization denotes a process of generating a set of N channels having different reliabilities, i.e., $\{W_N^{(i)}: 1 \le i \le N\}$, by using a given discrete storage channel W N times independently.

Once N polar channels having different reliabilities are generated, a polar codeword is configured to transmit frozen bits with fixed values via channels with a low reliability and transmit data bits or unfrozen bits via channels with a high reliability.

Examples of polar code decoding include successive cancellation decoding and list successive cancellation decoding. List successive cancellation decoding is also referred to as list decoding and is known to have the most powerful correction capability among the existing error correction code (ECC) decoding techniques.

However, since polar code decoding is highly complicated and has a very high decoding latency, the applicability of polar code decoding may be relatively low. Particularly, since decoding complexity and decoding latency are more important to a memory device than to a wireless communication system, it may be difficult to use polar codes as they are.

SUMMARY

Exemplary embodiments of the present disclosure provide a polar code decoding method capable of improving decoding complexity and decoding latency while maintaining its correction capacity.

Exemplary embodiments of the present disclosure also provide a polar code decoding apparatus capable of improving decoding complexity and decoding latency while maintaining its correction capacity.

Exemplary embodiments of the present disclosure also provide a memory control system capable of reducing error in characteristic data and improving performance using the characteristic data.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a polar code decoding method comprising generating a first sub-codeword by allowing an encoder to polar-encode first data, the first data including first unfrozen bits, which include first data bits and second data bits, and first frozen bits, generating a second sub-codeword by allowing the encoder to polar-encode a second pre-codeword, the second pre-codeword including second unfrozen bits, which include third data bits and the second data bits, and first frozen bits, allowing a decoder to decode the first and second sub-codewords and if the decoding of only one of the first and second sub-codewords succeeds, allowing the decoder to decode again the other sub-codeword that fails to be decoded using the second data bits.

According to the aforementioned and other exemplary embodiments of the present disclosure, there is provided a polar code decoding method comprising generating a first sub-codeword by allowing an encoder to polar-encode first data, the first data including first unfrozen bits, which include first data bits and second data bits, and first frozen bits, generating a second sub-codeword by allowing the encoder to polar-encode a second pre-codeword, the second pre-codeword including second unfrozen bits, which include third data bits and fourth data bits that are related to the second data bits, and first frozen bits, allowing a decoder to decode the first and second sub-codewords and if the decoding of only one of the first and second sub-codewords succeeds, allowing the decoder to decode again the other sub-codeword that fails to be decoded using the second data bits or the fourth data bits.

According to the aforementioned and other exemplary embodiments of the present disclosure, there is provided a polar code decoding method comprising generating a plurality of sub-codewords by allowing an encoder to polar-encode a plurality of pre-codewords, each of the pre-codewords including frozen bits and unfrozen bits, which include non-shared bits that are not shared between the pre-codewords and shared bits that are shared or correlated between the pre-codewords, allowing a decoder to perform primary decoding on the sub-codewords, acquiring the shared bits of at least one decoded sub-codeword obtained by the primary decoding and allowing the decoder to perform secondary decoding on at least one sub-codeword that fails to be decoded by the primary decoding using the acquired shared bits.

According to another exemplary embodiment, a polar code encoding and decoding method is provided including generating a first sub-codeword by polar-encoding a first pre-codeword, the first pre-codeword including first unfrozen bits and first frozen bits, wherein the first unfrozen bits include first data bits and second data bits; generating a second sub-codeword by polar-encoding a second pre-codeword, the second pre-codeword including second unfrozen bits and second frozen bits, wherein the second unfrozen bits include third data bits and the second data bits; decoding the first sub-codeword; decoding the second sub-codeword; and if the decoding of the first sub-codeword is successful and the decoding of the second sub-codeword is not successful: decoding the second sub-codeword a second time, using the second data bits recovered from the decoding of the first sub-codeword. In some embodiments the method also includes generating a third sub-codeword by polar-encoding third data, the third data including third unfrozen bits and third frozen bits, wherein the third unfrozen bits include fourth data bits and the second data bits; decoding the third sub-codeword; and when the decoding of the first sub-codeword is successful and the decoding of the second sub-codeword is not successful, if the decoding the third sub-codeword is not successful, decoding the third sub-codeword a second time, using the second data bits. In some embodiments, the second data bits are parity bits. In some embodiments, the second data bits are information bits. In some embodiments, the first unfrozen bits include a data region and a parity region, and wherein the parity region includes parity information of the data region.

Also provided is a polar code decoding apparatus including at least one processor configured to implement: a decoder configured to perform operations including: receiving a first sub-codeword and a second sub-codeword, wherein the first sub-codeword and the second sub-codeword are polar-encoded, decoding the first sub-codeword and the second sub-codeword into a first pre-codeword and a second pre-codeword, respectively, wherein the first pre-codeword includes first unfrozen bits and first frozen bits, wherein the first unfrozen bits include first data bits and second data bits, and the second pre-codeword includes second unfrozen bits and second frozen bits, wherein the first frozen bits include third data bits and fourth data bits, wherein the fourth data bits are related to the second data bits. The method includes receiving the second data bits from a frozen bit restorer, and decoding the first sub-codeword a second time, using the second data bits. The at least one processor also implements the frozen bit restorer configured to perform operations including: receiving the fourth bits from the decoder, acquiring the second data bits, and transmitting the acquired second data bits to the decoder if the first sub-codeword is not decoded successfully and the second sub-codeword is decoded successfully.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

A polar code decoding apparatus according to some exemplary embodiments of the present disclosure will hereinafter be described.

Figure 1:
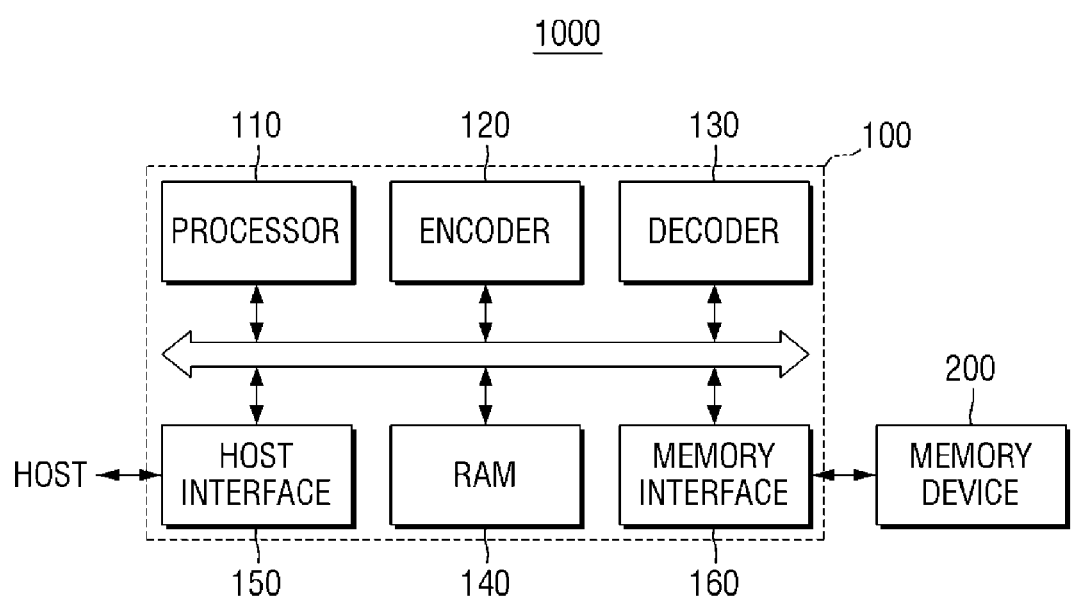
FIG. 1 is a block diagram of a polar code decoding apparatus according to some exemplary embodiments of the present disclosure.
Figure 2:
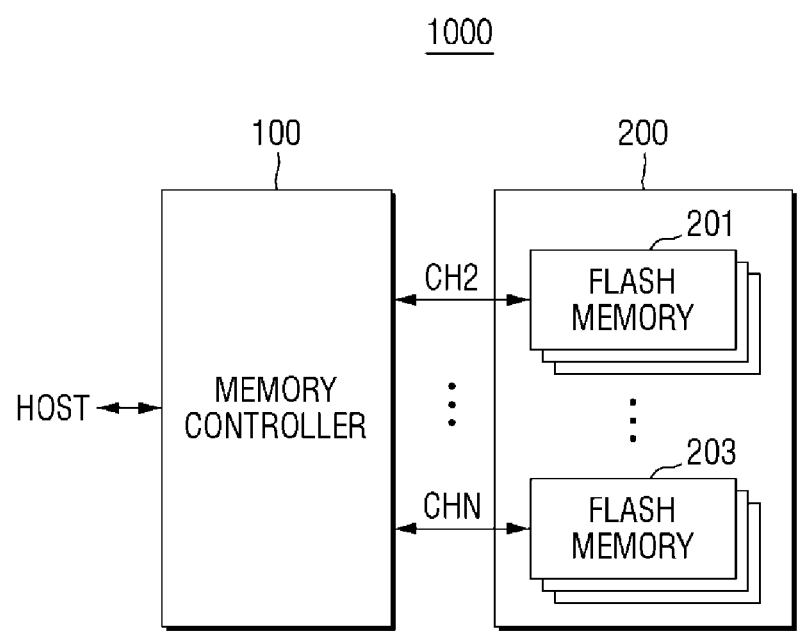
FIG. 2 is a block diagram of the polar code decoding apparatus according to some exemplary embodiments of the present disclosure.

FIG. 1 is a block diagram of a polar code decoding apparatus according to some exemplary embodiments of the present disclosure, and FIG. 2 is a block diagram of the polar code decoding apparatus according to some exemplary embodiments of the present disclosure.

Referring to FIGS. 1 and 2, a polar code decoding apparatus 1000 includes a memory controller 100 and a memory device 200.

The memory device 200 may be implemented as a non-volatile memory device. For example, the memory device 200 may be implemented as a flash memory device, a phase-change random access memory (PRAM) device, a ferroelectric random access memory (FRAM) device, or a magnetic random access memory (MRAM) device. The memory device 200 may include at least one nonvolatile memory device and at least one volatile memory device or may include a plurality of nonvolatile memory devices of at least two different types.

The memory device 200 may consist of a single flash chip. Alternatively, the memory device 200 may consist of a plurality of flash memory chips.

The memory controller 100 includes a processor 110, an encoder 120, a decoder 130, a random access memory (RAM) 140, a host interface 150, a memory interface 160, and a bus 170.

The processor 110 is electrically connected to the encoder 120, the decoder 130, the RAM 140, the host interface 150, and the memory interface 160 via the bus 170.

The bus 170 refers to a path via which information is transmitted between the elements of the memory controller 100.

The processor 110 controls the general operation of the polar code decoding apparatus 1000. Specifically, the processor 110 interprets a command received from a host and controls the polar code decoding apparatus 100 to perform an operation in accordance with the result of the interpretation.

The processor 110 provides a read command and an address to the memory device 200 during a read operation and provides a write command, an address, and an encoded codeword to the memory device 200 during a write operation. The processor 110 translates a logical address received from the host into a physical page address (PPA) using metadata stored in the RAM 140.

In the RAM 140, data received from the host and data generated by the processor 110 may be temporarily stored, or data read by the memory device 200 may be temporarily stored. In the RAM 140, metadata read from the memory device 200 may also be stored. In the RAM 140, information necessary for performing encoding or decoding may also be stored. The RAM 140 may be implemented as a dynamic RAM (DRAM) or a static RAM (SRAM).

As used herein, the term "metadata" refers to data generated by the polar code decoding apparatus 100 to manage the memory device 200. Metadata, which is management information, includes mapping table information for use in the translation of logical addresses into PPAs of the memory device 200. For example, metadata may include page mapping table information for performing address mapping in units of pages. Also, metadata may include information for managing the storage space of the memory device 200.

The host interface 150 includes a protocol for exchanging data with the host, which is connected to the memory device 200, and may connect the memory device 200 and the host. The host interface 150 may be implemented as an advanced technology attachment (ATA) interface, a serial ATA (SATA) interface, a parallel ATA (PATA) interface, a universal serial bus (USB) or serial attached small computer system (SAS) interface, a small computer system interface (SCSI), an embedded multi-media card (eMMC) interface, or a Unix file system (UFS) interface, but the present disclosure is not limited thereto. Specifically, the host interface 150 may exchange commands, addresses, and data with the host under the control of the processor 110.

The memory interface 160 is electrically connected to the memory device 200. The memory interface 160 may be configured to support an interface with a NAND flash memory chip or a NOR flash memory chip. The memory interface 160 may allow software and hardware interleave operations to be selectively performed via a plurality of channels.

As the polar code decoding apparatus 100 is powered on, the processor 110 controls the polar code decoding apparatus 100 to read metadata and information for performing encoding or decoding from the memory device 200 and to store the read metadata and the read information in the RAM 140. The processor 110 controls the polar code decoding apparatus 100 to update the metadata stored in the RAM 140 in accordance with a metadata update operation of the memory device 200. The processor 110 controls the polar code decoding apparatus 100 to write the metadata stored in the RAM 140 to the memory device 200 before the polar code decoding apparatus 100 is powered off.

During a write operation, the processor 110 controls the memory controller 110 to encode an information word received from the host using an encoding method provided in the present disclosure. During a read operation, the processor 110 controls the memory controller 100 to decode data read from the memory device 200 using a decoding method provided in the present disclosure.

The encoder 120 encodes the information word received from the host using a polar code. The polar code may be a binary polar code or a non-binary polar code. Specifically, an input symbol vector is generated by combining the information word received from the host with frozen bits, and codeword symbols are generated using the input symbol vector and a matrix. This will be described later in detail.

The decoder 130 decodes data read from the memory device 200 using a polar decoding method provided in the present disclosure. This will be described later in detail.

The memory device 200 of the polar code decoding apparatus 1000 may include a plurality of flash memory chips 201 and 203, but the present disclosure is not limited thereto.

The polar code decoding apparatus 1000 may have N channels (where N is a natural number) and may include a plurality of flash memory chips for each of the N channels. The number of flash memory chips provided for each of the N channels may vary.

Figure 3:
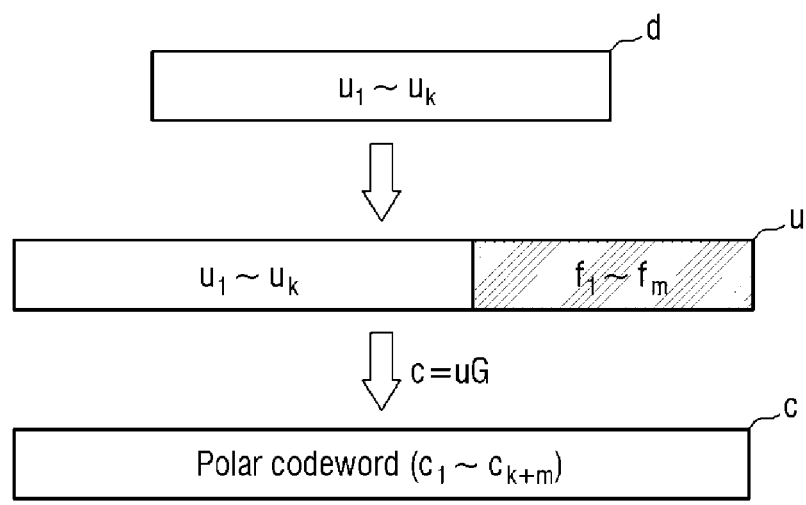
FIG. 3 illustrates an operation of the encoder of the polar coding apparatus according to some exemplary embodiments of the present disclosure.

FIG. 3 illustrates an operation of the encoder of the polar coding apparatus according to some exemplary embodiments of the present disclosure.

Polar code encoding performed by the encoder 120 will hereinafter be described with reference to FIGS. 1 and 3.

Referring to FIGS. 1 and 3, data d may be unfrozen bits $u_1$ through $u_k$. First, frozen bits $f_1$ through $f_m$ are added to the unfrozen bits $u_1$ through $u_k$. The unfrozen bits $u_1$ through $u_k$ are k bits, and the frozen bits $f_1$ through $f_m$ are m bits. Thus, a pre-codeword u may have a size in bits of k+m before being encoded.

An input code having a size in bits of k+m may be encoded into a polar codeword c having a size in bits of k+m. The encoding of the input code may be defined as the following vector operation: c=uG. The polar codeword c may include polar codes $c_1$ through $c_{k+m}$, which are (k+m) bits.

The frozen bits $f_1$ through $f_m$ may be bits that are already known to the decoder 130. Each of the frozen bits $f_1$ through $f_m$ may be represented as "0", but the present disclosure is not limited thereto. That is, alternatively, the frozen bits $f_1$ through $f_m$ may have a value other than zero as long as their value is already known to the decoder 130. The decoder 130 already has information on the frozen bits $f_1$ through $f_m$ and may use the information to decode polar codes.

Figure 4:
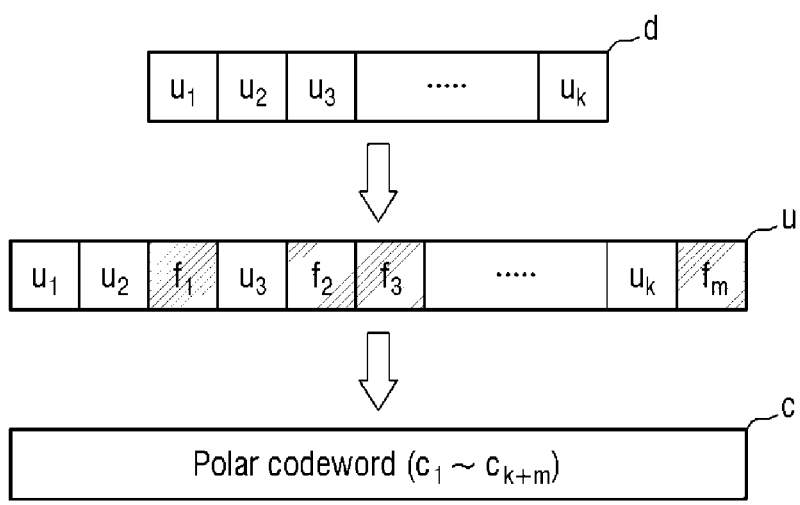
FIG. 4 illustrates an operation of the encoder of the polar coding apparatus according to some exemplary embodiments of the present disclosure.

FIG. 4 illustrates an operation of the encoder of the polar coding apparatus according to some exemplary embodiments of the present disclosure.

Referring to FIGS. 1 and 4, the unfrozen bits $u_1$ through $u_k$ and the frozen bits $f_1$ through $f_m$ of the input code may be interleaved, unlike what is shown in FIG. 3. That is, the unfrozen bits $u_1$ through $u_k$ and the frozen bits $f_1$ through $f_m$ may be interleaved, rather than being arranged side-by-side according to their type. Specifically, the frozen bit $f_1$ may be arranged between the unfrozen bits $u_2$ and $u_3$.

The decoder 130 may already have information on the arrangement of the frozen bits $f_1$ through $f_m$. Due to the characteristics of polar codes, the unfrozen bits $u_1$ through $u_k$ and the frozen bits $f_1$ through $f_m$ may have different qualities (or reliabilities) depending on locations (i.e., depending on channels). Thus, the frozen bits $f_1$ through $f_m$ may be allocated to channels with a poor information capacity performance, or quality, and the unfrozen bits $u_1$ through $u_k$ may be allocated to channels with a good information capacity performance or quality. In this manner, the success probability of decoding may be improved.

Figure 5:
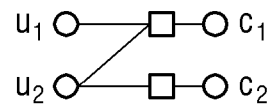
FIGS. 5 through 7 illustrate operations of the encoder of the polar coding apparatus according to some exemplary embodiments of the present disclosure.
Figure 6:
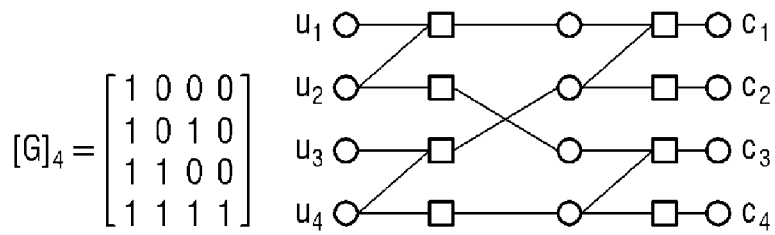
Figure 7:
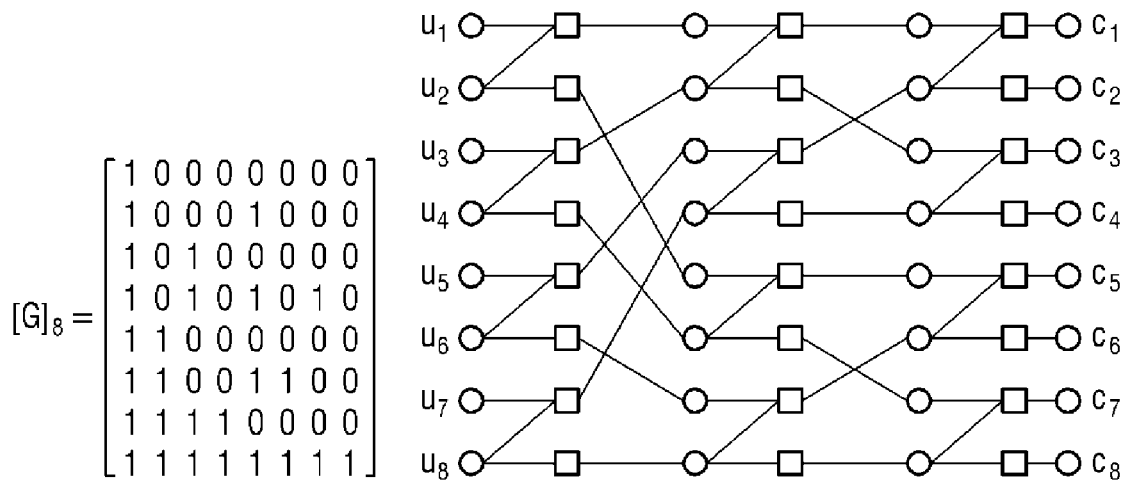

FIGS. 5 through 7 illustrate operations of the encoder of the polar coding apparatus according to some exemplary embodiments of the present disclosure.

Referring to FIG. 5, polar code encoding may be defined by a 2×2 matrix $[G]_2$. In general, the theoretical encoding operation may be written in matrix form as c=uG, where u is a row vector of pre-codeword bits, and c is a row vector of codeword bits (both unfrozen and frozen in FIGS. 5-7), and G is an encoding matrix. The polar code bit $c_1$ may be defined as the sum of the bits $u_1$ and $u_2$, and the bit $u_2$ may be output as the polar code bit $c_2$, and the codeword c=[$c_1$ $c_2$].

Referring to FIG. 6, polar code encoding may be defined by a 4×4 matrix $[G]_4$, the polar code $c_1$ may be defined as the sum of the bits $u_1$, $u_2$, $u_3$, and $u_4$, and the bit $u_4$ may be output as the polar code $c_4$; the output codeword is [$c_1$ $c_2$ $c_3$ $c_4$].

Referring to FIG. 7, polar code encoding may be defined by an 8×8 matrix $[G]_8$, the polar code $c_1$ may be defined as the sum of the bits $u_1$ through $u_8$, and the bit $u_8$ may be output as the polar code $c_8$; the output codeword is [$c_1$ $c_2$ $c_3$ $c_4$ $c_5$ $c_6$ $c_7$ $c_8$].

Assuming that the paths via which the polar codes $c_1$ through $c_8$ are decoded into $u_1$ through $u_8$ are defined as channels, the quality of the channels may refer to the probability of decoding. That is, a channel with a good quality may refer to a high probability of successful decoding, and a channel with a bad quality may refer to a low probability of successful decoding.

Referring to FIG. 7, a channel with a highest quality may be a channel conveying $u_8$, and a channel with a lowest quality may be a channel conveying bit $u_1$.

Polar codes may have different qualities for different channels. In theory, the longer polar codes become, the more likely the quality of channels is to be polarized. That is, for longer polar codes, the higher the ratio of channels with a relatively high or low quality.

Figure 8:
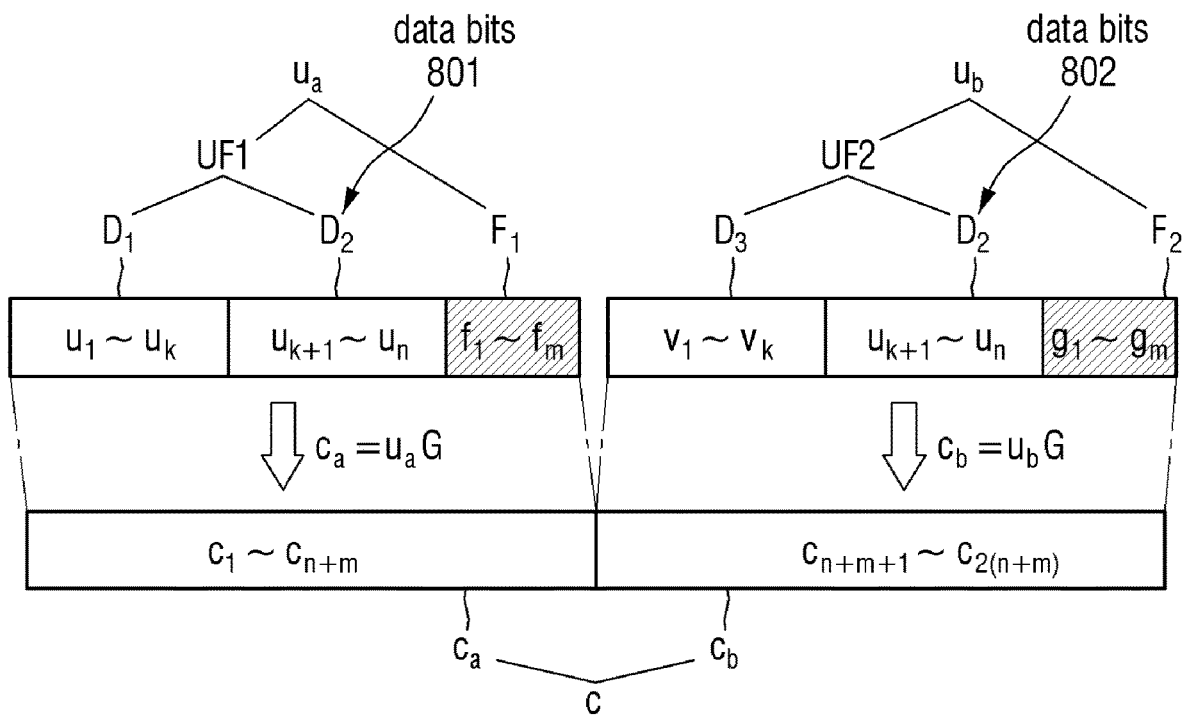
FIG. 8 illustrates operations of the encoder and the decoder of the polar coding apparatus according to some exemplary embodiments of the present disclosure.

FIG. 8 illustrates operations of the encoder and the decoder of the polar coding apparatus according to some exemplary embodiments of the present disclosure.

Referring to FIG. 8, the encoder 120 may polar-encode two pre-codewords, i.e., first and second pre-codewords $u_a$ and $u_b$, and may then concatenate the polar-encoded pre-codewords.

Specifically, the first pre-codeword $u_a$ may include first unfrozen bits $UF_1$ and first frozen bits $F_1$. The first unfrozen bits $UF_1$ may include first data bits $D_1$ and second data bits $D_2$. Generally, first data bits $D_1$ and second data bits $D_2$ may be information bits (unrelated to any previous encoding operation).

The first data bits $D_1$ are k bits and may refer to bits $u_1$ through $u_k$. The bits $u_1$ through $u_k$ may be close to one another, as illustrated in FIG. 3, or may be apart from one another, as illustrated in FIG. 4.

The second data bits $D_2$ are (n-k) bits and may refer to bits $u_{k+1}$ through $u_n$. The bits $u_{k+1}$ through $u_n$ may be close to one another, as illustrated in FIG. 3, or may be apart from one another, as illustrated in FIG. 4.

The first frozen bits $F_1$ are m bits and may refer to bits $f_1$ through $f_m$. The bits $f_1$ through $f_m$ may be close to one another, as illustrated in FIG. 3, or may be apart from one another, as illustrated in FIG. 4.

That is, FIG. 8 illustrates the first data bits $D_1$, the second data bits $D_2$, and the first frozen bits $F_1$ as being simply concatenated without being interleaved, but in some exemplary embodiments of the present disclosure, the first data bits $D_1$, the second data bits $D_2$, and the first frozen bits $F_1$ may be interleaved.

Similarly, the second pre-codeword $u_b$ may include second unfrozen bits $UF_2$ and second frozen bits $F_2$. The second unfrozen bits $UF_2$ may include third data bits $D_3$ and the second data bits $D_2$.

The third data bits $D_3$ are k bits and may refer to bits $v_1$ through $v_k$. The bits $v_1$ through $v_k$ may be close to one another, as illustrated in FIG. 3, or may be apart from one another, as illustrated in FIG. 4.

The second data bits $D_2$ may be the same as the second data bits $D_2$ of the first pre-codeword $u_a$. Data bits 801 and data bits 802 are the same data bits, indicated as '$D_2$' in FIG. 8. Repeated data bits 801 and 802 are referred to herein as shared data bits. In some embodiments, shared bits not repeated bits but exhibit some correlation aspect.

The second frozen bits $F_2$ are m bits and may refer to bits $g_1$ through $g_m$. The bits $g_1$ through $g_m$ may be close to one another, as illustrated in FIG. 3, or may be apart from one another, as illustrated in FIG. 4.

That is, in some exemplary embodiments, the third data bits $D_3$, the second data bits $D_2$, and the second frozen bits $F_2$ may be interleaved.

The first pre-codeword $u_a$ may be encoded into a first sub-polar codeword $C_a$ by a polar encoding matrix G, and the second pre-codeword $u_b$ may be encoded into a second sub-polar codeword $C_b$ by the polar encoding matrix G.

The first and second sub-polar codewords $C_a$ and $C_b$ may be concatenated to each other and may thus form the polar codeword c.

As already mentioned above, the first frozen bits $F_1$ and the second frozen bits $F_2$ are values that are already known to the decoder 130 of FIG. 1 and may be normally zeros, but the present disclosure is not limited thereto.

FIG. 8 illustrates the first frozen bits $F_1$ and the second frozen bits $F_2$ as both being m bits, but the present disclosure is not limited thereto. That is, in some exemplary embodiments, the first frozen bits $F_1$ and the second frozen bits $F_2$ have different sizes in bits.

Figure 9:
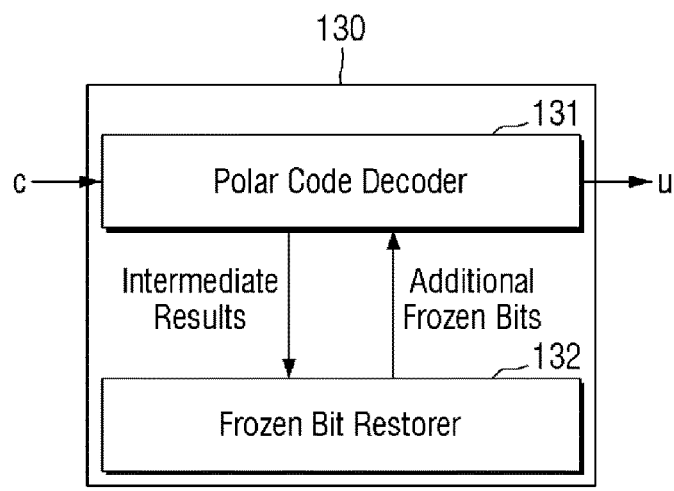
FIG. 9 is a block diagram of an example of the decoder of the polar code decoding apparatus according to some exemplary embodiments of the present disclosure.

FIG. 9 is a block diagram of an example of the decoder of the polar code decoding apparatus according to some exemplary embodiments of the present disclosure.

Referring to FIGS. 8 and 9, the decoder 130 may include a polar code decoder 131 and a frozen bit restorer 132.

The decoder 130 may receive the polar codeword c and may output the pre-codeword u.

Specifically, the polar code decoder 131 may receive the polar codeword c. The polar codeword c, received by the polar code decoder 131, may include the first and second sub-polar codewords $C_a$ and $C_b$. The polar code decoder 131 attempts to acquire the first pre-codeword $u_a$ by decoding the first sub-polar codeword $C_a$, and attempts to acquire the second pre-codeword $u_b$ by decoding the second sub-polar codeword $C_b$. The decoding of the first sub-polar codeword $C_a$ and the decoding of the second sub-polar codeword $C_b$ may be performed one after another. The decoding of the first sub-polar codeword $C_a$ and the decoding of the second sub-polar codeword $C_b$ may be performed independently of each other.

The success probability of decoding may vary depending on the quality of a channel, and the success or failure of decoding may also vary from one sub-polar codeword to another sub-polar codeword.

If the decoding of all sub-polar codewords of a polar codeword succeeds, the decoding of the polar codeword may be finished. Also, if the decoding of all sub-polar codewords of a polar codeword fails, the decoding of the polar codeword may be finished.

On the other hand, if the decoding of only some sub-polar codewords of a polar codeword succeeds, the decoding of the polar codeword may not be readily finished.

The second data bits $D_2$ may be included in both the first and second pre-codewords $u_a$ and $u_b$. That is, the second data bits $D_2$ may serve as shared bits between the first and second pre-codewords $u_a$ and $u_b$. Referring to FIG. 8, the first data bits $D_1$ are non-shared bits and the third data bits $D_3$ are non-shared bits.

If the decoding of the first sub-polar codeword $u_a$ fails and the decoding of only the second sub-polar codeword $u_b$ succeeds, the third data bits $D_3$ and the second data bits $D_2$ of the second pre-codeword $u_b$, may be transmitted to the frozen bit restorer 132 as intermediate results.

As a result, the second data bits $D_2$, which are the shared bits between the first and second pre-codewords $u_a$ and $u_b$, may be disclosed.

The frozen bit restorer 132 may transmit the disclosed second data bits $D_2$ to the polar code decoder 131 as additional frozen bits.

The polar code decoder 131 may use the first frozen bits $F_1$ and the second data bits $D_2$ to decode the first sub-polar codeword $C_a$. That is, since frozen bits are bits that are already known to the polar code decoder 131, the polar code decoder 131 may use not only the first frozen bits $F_1$, which are already known before the decoding of the first and second sub-polar codewords $C_a$ and $C_b$, but also the second data bits $D_2$, which are disclosed in the process of decoding the second sub-polar codeword $C_b$, as frozen bits to decode the first data bits $D_1$, which are yet to be disclosed.

At this time, the ratio of frozen bits is higher than at the initial stage of decoding the first and second sub-polar codewords $C_a$ and $C_b$, and thus, the success probability of decoding may also be higher than at the initial stage of decoding the first and second sub-polar codewords $C_a$ and $C_b$. Accordingly, the polar code decoder 131 may attempt to decode the first sub-polar codeword $C_a$ with an increased success probability of decoding.

On the other hand, if the decoding of the second sub-polar codeword $u_b$ fails and the decoding of only the first sub-polar codeword $u_a$ succeeds, the first data bits $D_1$ and the second data bits $D_2$ of the first pre-codeword $u_a$, may be transmitted to the frozen bit restorer 132 as intermediate results.

Accordingly, the second data bits $D_2$, which are the shared bits between the first and second pre-codewords $u_a$ and $u_b$, may be disclosed.

The frozen bit restorer 132 may transmit the disclosed second data bits $D_2$ to the polar code decoder 131 as additional frozen bits.

The polar code decoder 131 may use the second frozen bits $F_2$ and the second data bits $D_2$ to decode the second sub-polar codeword $C_b$. That is, since frozen bits are bits that are already known to the polar code decoder 131, the polar code decoder 131 may use not only the second frozen bits $F_2$, which are already known before the decoding of the first and second sub-polar codewords $C_a$ and $C_b$, but also the second data bits $D_2$, which are disclosed in the process of decoding the first sub-polar codeword $C_a$, as frozen bits to decode the third data bits $D_3$, which are yet to be disclosed.

Accordingly, the polar code decoder 131 may attempt to decode the second sub-polar codeword $C_b$ with an increased success probability of decoding.

The polar code decoding apparatus according to the exemplary embodiment of FIG. 9 can considerably reduce decoding complexity and decoding latency. Also, the polar code decoding apparatus according to the exemplary embodiment of FIG. 9 still can provide as high correction capability as conventional polar code decoding. Also, since partial decoding can be enabled, the polar code decoding apparatus according to the exemplary embodiment of FIG. 9 can perform partial error correction through partial decoding even when an overall decoding is impossible.

Polar code encoding and decoding methods according to some exemplary embodiments of the present disclosure will hereinafter be described with reference to FIG. 10, and descriptions of elements and reference numerals that have already been described above with reference to FIGS. 1 through 9 will be omitted or at least simplified.

Figure 10:
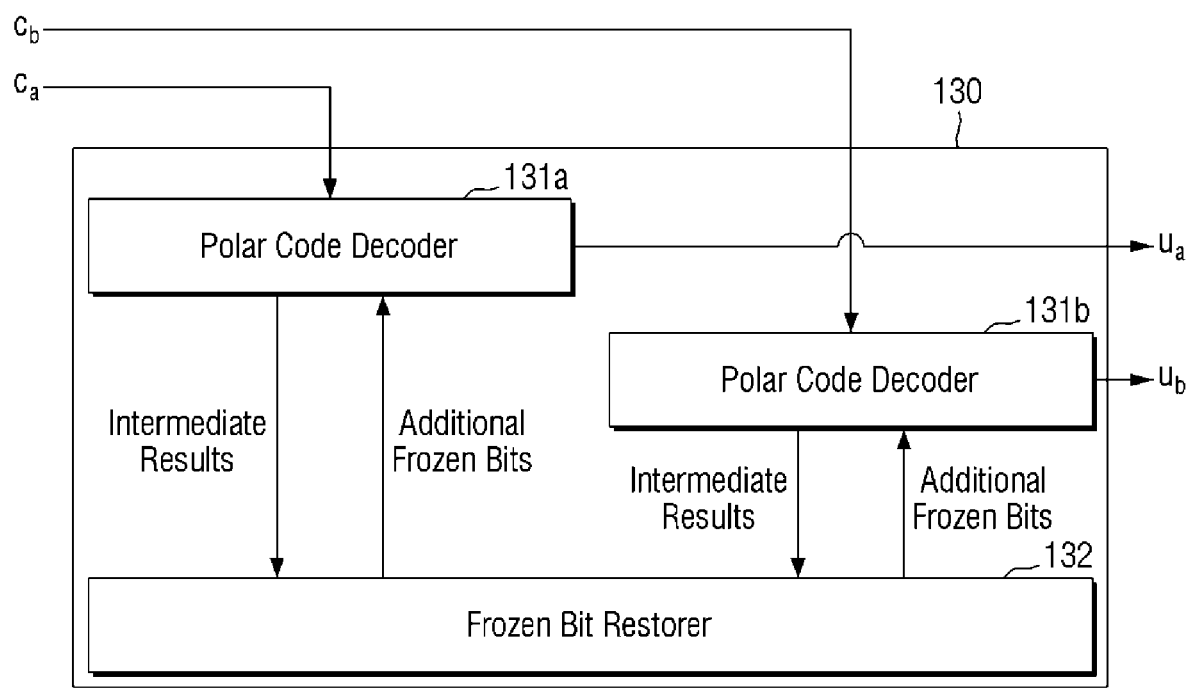
FIG. 10 is a block diagram of another example of the decoder of the polar code decoding apparatus according to some exemplary embodiments of the present disclosure.

FIG. 10 is a block diagram of another example of the decoder of the polar code decoding apparatus according to some exemplary embodiments of the present disclosure.

Referring to FIG. 10, the decoder 130 includes a first polar code decoder 131a, a second polar code decoder 131b, and a frozen bit restorer 132.

That is, the decoder 130 may include a plurality of polar code decoders (130a and 130b).

The first polar code decoder 131a may receive the first sub-polar codeword $C_a$ and may output the first pre-codeword $u_a$. The second polar code decoder 131b may receive the second sub-polar codeword $C_b$ and may output the second pre-codeword $u_b$.

The frozen bit restorer 132 may receive intermediate results from the first and second polar code decoders 131a and 131b and may provide additional frozen bits.

Since a plurality of polar code decoders are provided in the decoder 130, the amount of time that it takes to decode sub-polar codewords that are independent from each other can be further reduced. That is, the decoding of the first sub-polar codeword $C_a$ and the decoding of the second sub-polar codeword $C_b$ may be performed at the same time, and as a result, the polar code decoding apparatus according to the exemplary embodiment of FIG. 10 can considerably reduce decoding latency.

The first and second polar code decoders 131a and 131b may have the same structure. Thus, even if the first sub-polar codeword $C_a$ is input to the second polar code decoder 131b and the second sub-polar codeword $C_b$ is input to the first polar code decoder 131a, the first and second pre-codewords $u_a$ and $u_b$ may still be output from the polar code decoder 131.

That is, since there is no restriction on which polar code decoder 131 is to be used to decode which polar codeword, there is no need to allocate resources.

Encoding and decoding methods of the polar code decoding apparatus according to some exemplary embodiments of the present disclosure will hereinafter be described with reference to FIGS. 1 and 11, and descriptions of elements and reference numerals that have already been described above with reference to FIGS. 1 through 10 will be omitted or at least simplified.

Figure 11:
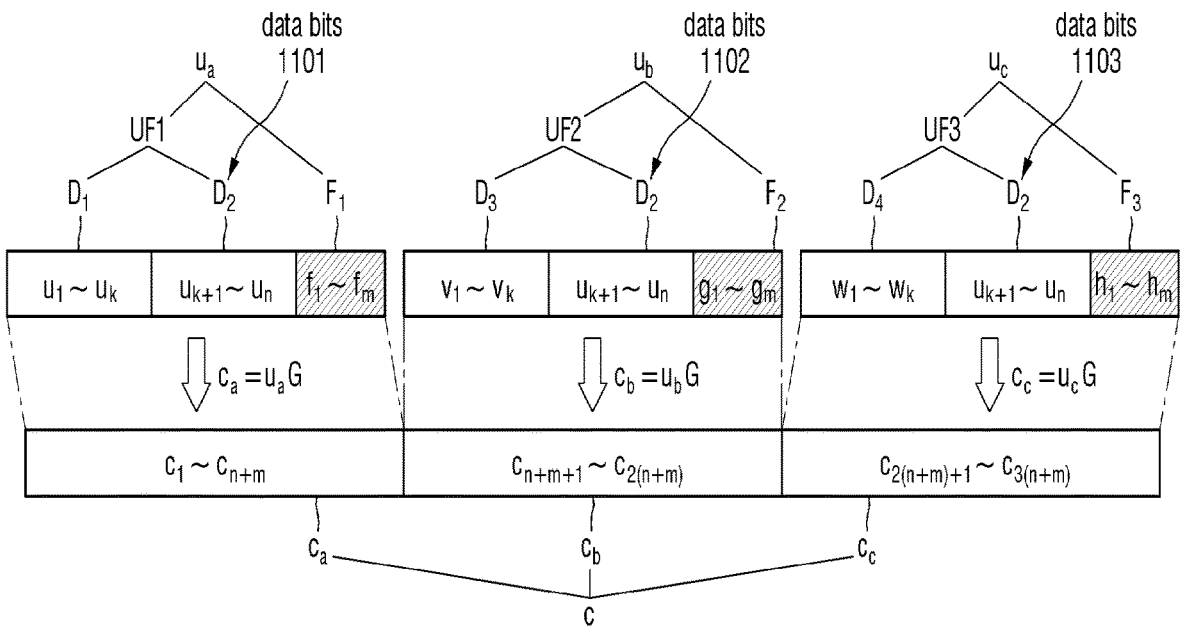
FIG. 11 illustrates encoding and decoding methods of the polar code decoding apparatus according to some exemplary embodiments of the present disclosure.

FIG. 11 illustrates encoding and decoding methods of the polar code decoding apparatus according to some exemplary embodiments of the present disclosure.

Referring to FIGS. 1 and 11, the encoder 120 may encode and concatenate three pre-codewords, i.e., the first and second pre-codewords $u_a$ and $u_b$ and a third pre-codeword $u_c$.

Specifically, the third pre-codeword $u_c$ may include third unfrozen bits UF3 and third frozen bits $F_3$. The third unfrozen bits UF3 may include fourth data bits $D_4$ and second data bits $D_2$.

The fourth data bits $D_4$ are k bits and may refer to bits $w_1$ through $w_k$. The bits $w_1$ through $w_k$ may be close to one another, as illustrated in FIG. 3, or may be apart from one another, as illustrated in FIG. 4.

The second data bits $D_2$ may be the same as the second data bits $D_2$ included in the first or second unfrozen bits UF1 or UF2.

The third frozen bits $F_3$ are m bits and may refer to bits $h_1$ through $h_m$. The bits $h_1$ through $h_m$ may be close to one another, as illustrated in FIG. 3, or may be apart from one another, as illustrated in FIG. 4.

That is, the fourth data bits $D_4$, the second data bits $D_2$, and the third frozen bits $F_3$ may be interleaved.

The first pre-codeword $u_a$ may be encoded into the first sub-polar codeword $C_a$ by the polar encoding matrix G, and the second pre-codeword $u_b$ may be encoded into the second sub-polar codeword $C_b$ by the polar encoding matrix G. Similarly, the third pre-codeword $u_c$ may be encoded into a third sub-polar codeword $C_c$ by the polar encoding matrix G.

The first, second, and third sub-polar codewords $C_a$, $C_b$, and $C_c$ may be concatenated to one another and may thus form the polar codeword c.

The decoder 130 may decode the first, second, and third sub-polar codewords $C_a$, $C_b$, and $C_c$ first.

If the decoding of all sub-polar codewords of a polar codeword succeeds, the decoding of the polar codeword may be finished. Also, if the decoding of all sub-polar codewords of a polar codeword fails, the decoding of the polar codeword may be finished. On the other hand, if the decoding of only some sub-polar codewords of a polar codeword succeeds, the decoding of the polar codeword may not be readily finished.

The second data bits $D_2$ may be included in all the first, second, and third pre-codewords $u_a$, $u_b$, and $u_c$. That is, the second data bits $D_2$ may serve as shared bits between the first, second, and third pre-codewords $u_a$, $u_b$, and $u_c$. For example, data bits 1101, data bits 1102, and data bits 1103 are the same data bits, indicated as '$D_2$' in FIG. 11. Repeated data bits 1101, 1102, and 1103 are referred to herein as shared data bits.

If the decoding of at least one of the first, second, and third sub-polar codewords $C_a$, $C_b$, and $C_c$ succeeds, the second data bits $D_2$, which are the shared bits between the first, second, and third pre-codewords $u_a$, $u_b$, and $u_c$, may be used as additional frozen bits for the sub-polar codewords that fail to be decoded. As a result, the decoding of the sub-polar codewords that fail to be decoded may be performed again with an increased success probability of decoding.

In short, the polar code decoding apparatus according to the exemplary embodiment of FIG. 11 obtains a polar codeword by concatenating three pre-codewords. Thus, even if the decoding of only one of the three pre-codewords succeeds, the other pre-codewords can be additionally decoded with an increased success probability of decoding, and as a result, the probability of decoding can be considerably improved. Also, the polar code decoding apparatus according to the exemplary embodiment of FIG. 11 can considerably reduce decoding latency and decoding complexity.

The encoding and the decoding of three pre-codewords have been described above, but the present disclosure is not limited thereto. That is, the polar code decoding apparatus according to the exemplary embodiment of FIG. 11 can perform encoding or decoding using four or more pre-codewords.

Encoding and decoding methods of the polar code decoding apparatus according to some exemplary embodiments of the present disclosure will hereinafter be described with reference to FIGS. 1 and 12, and descriptions of elements and reference numerals that have already been described above with reference to FIGS. 1 through 11 will be omitted or at least simplified.

Figure 12:
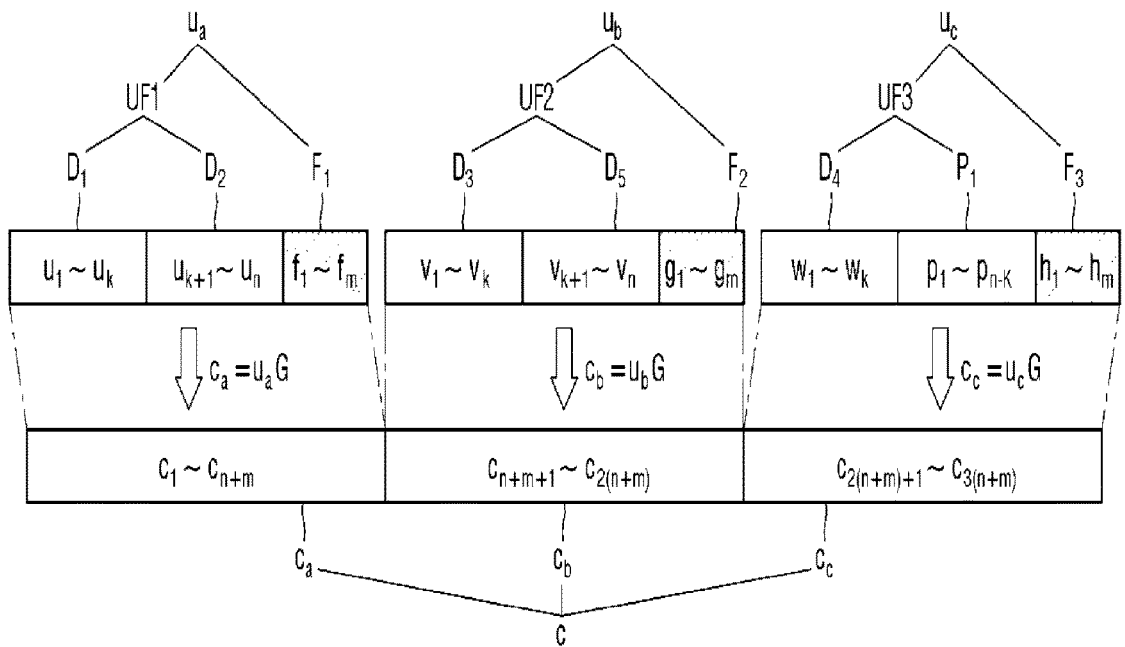
FIG. 12 illustrates encoding and decoding methods of the polar code decoding apparatus according to some exemplary embodiments of the present disclosure.

FIG. 12 illustrates encoding and decoding methods of the polar code decoding apparatus according to some exemplary embodiments of the present disclosure.

Referring to FIGS. 1 and 12, the second pre-codeword $u_b$ may include fifth data bits $D_5$, which are different from the second data bits $D_2$, and the third pre-codeword $u_c$ may include first parity bits $P_1$, which include parity information of the second data bits $D_2$ and parity information of the fifth data bits $D_5$. Because $P_1$ is related to $D_2$ and to D5, the unfrozen bits UF1, UF2, and UF3 are correlated. For example, UF1, UF2 and UF3 are not independent in a statistical sense. In general, $P_1$ can include first parity bits computed over $D_2$ and second parity bits computed over $D_5$. Because $P_1$ depends on $D_2$, $P_1$ is referred to herein as being correlated with $D_2$ or as having a relationship with $D_2$.

The encoder 120 may generate the first, second, and third sub-polar codewords $C_a$, $C_b$, and $C_c$ by polar-encoding the first, second, and third pre-codewords $u_a$, $u_b$, and $u_c$, respectively. The encoder 120 may generate the polar codeword c by concatenating the first, second, and third sub-polar codewords $C_a$, $C_b$, and $C_c$.

If the decoding of two of the first, second, and third sub-polar codewords $C_a$, $C_b$, and $C_c$ succeeds, the decoder 130 may attempt to decode the other sub-polar codeword again.

Specifically, if the decoding of the first and second sub-polar codewords $C_a$ and $C_b$ succeeds and the decoding of the third sub-polar codeword $C_c$ fails, the first parity bits $P_1$ may be restored based on the second data bits $D_2$ and the fifth data bits $D_5$, which are all disclosed in the process of decoding the first and second sub-polar codewords $C_a$ and $C_b$.

In this case, the decoder 130 may use not only the third frozen bits $F_3$, but also the restored first parity bits $P_1$, as frozen bits to decode the third pre-codeword $u_c$.

Similarly, if the decoding of the first and third sub-polar codewords $C_a$ and $C_c$ succeeds and the decoding of the second sub-polar codeword $C_b$ fails, the fifth data bits $D_5$ may be restored based on the second data bits $D_2$ and the first parity bits $P_1$, which are all disclosed in the process of decoding the first and third sub-polar codewords $C_a$ and $C_c$.

In this case, the decoder 130 may use not only the second frozen bits $F_2$, but also the restored fifth data bits $D_5$, as frozen bits to decode the second pre-codeword $u_b$.

Similarly, if the decoding of the second and third sub-polar codewords $C_b$ and $C_c$ succeeds and the decoding of the first sub-polar codeword $C_a$ fails, the second data bits $D_2$ may be restored based on the fifth data bits $D_5$ and the first parity bits $P_1$, which are all disclosed in the process of decoding the second and third sub-polar codewords $C_b$ and $C_c$.

In this case, the decoder 130 may use not only the second frozen bits $F_2$, but also the restored second data bits $D_2$, as frozen bits to decode the first pre-codeword $u_a$.

The polar code decoding apparatus according to the exemplary embodiment of FIG. 12 can minimize shared bits between three pre-codewords. That is, since the second data bits $D_2$ include different data from the fifth data bits $D_5$, a larger amount of data can be acquired through decoding than when the second data bits $D_2$ and the fifth data bits $D_5$ overlap.

Encoding and decoding methods of the polar code decoding apparatus according to some exemplary embodiments of the present disclosure will hereinafter be described with reference to FIGS. 1 and 13, and descriptions of elements and reference numerals that have already been described above with reference to FIGS. 1 through 12 will be omitted or at least simplified.

Figure 13:
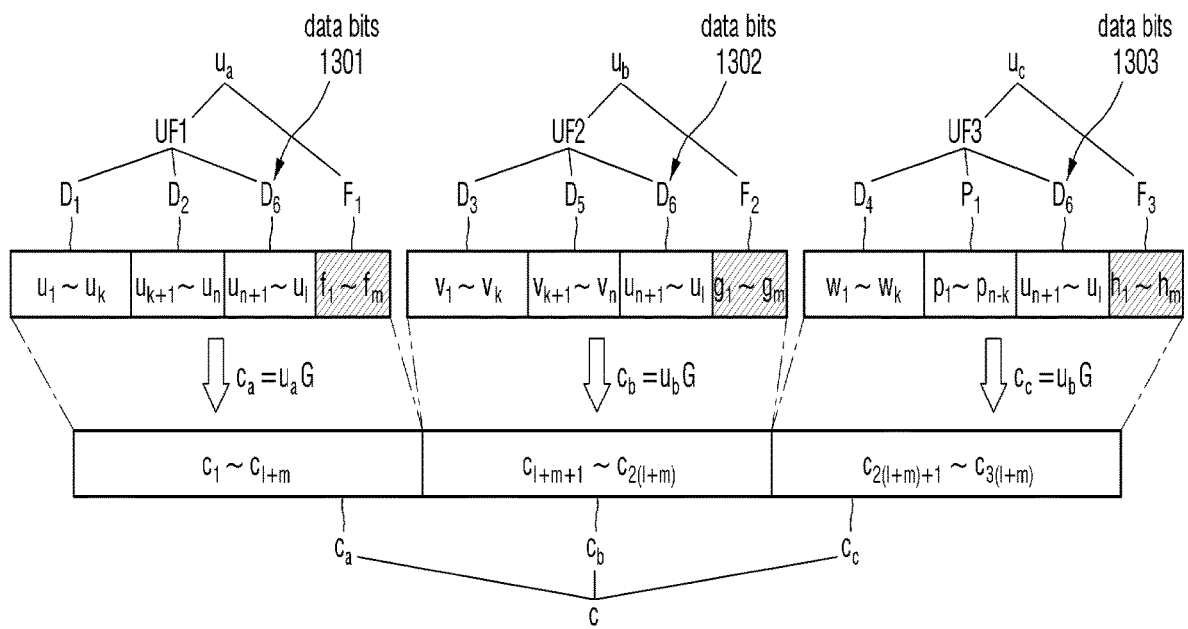
FIG. 13 illustrates encoding and decoding methods of the polar code decoding apparatus according to some exemplary embodiments of the present disclosure.

FIG. 13 illustrates encoding and decoding methods of the polar code decoding apparatus according to some exemplary embodiments of the present disclosure.

Referring to FIGS. 1 and 13, the first pre-codeword $u_a$ may include the first unfrozen bits UF1 and the first frozen bits $F_1$. The first unfrozen bits UF1 may include the first data bits $D_1$, the second data bits $D_1$, and sixth data bits $D_6$. Data bits 1301 of $u_a$, data bits 1102 of $u_b$, and data bits 1103 of $u_c$ are the same data bits, indicated as '$D_6$' in FIG. 13. Repeated data bits 1301, 1302, and 1303 are referred to herein as shared data bits. The unfrozen bits UF1, UF2, and UF3 form a plurality of bits. Included within this plurality of bits are $D_2$, $D_6$, $D_5$, and $P_1$. $D_2$, $D_6$, $D_5$, and $P_1$ may be referred to herein as a second plurality of bits.

In some exemplary embodiments, the first data bits $D_1$, the second data bits $D_1$, the sixth data bits $D_6$, and the first frozen bits $F_1$ may be interleaved.

The second pre-codeword $u_b$ may include the second unfrozen bits UF2 and the second frozen bits $F_2$. The second unfrozen bits UF2 may include the third data bits $D_3$, the fifth data bits $D_5$, and the sixth data bits $D_6$.

In some exemplary embodiments, the third data bits $D_3$, the fifth data bits $D_5$, the sixth data bits $D_6$, and the second frozen bits $F_2$ may be interleaved.

The third pre-codeword $u_c$ may include the third unfrozen bits UF3 and the third frozen bits $F_3$. The third unfrozen bits UF3 may include the fourth data bits $D_4$, the first parity bits $P_1$, and the sixth data bits $D_6$.

In some exemplary embodiments, the fourth data bits $D_4$, the first parity bits $P_1$, the sixth data bits $D_6$, and the third frozen bits $F_3$ may be interleaved.

The encoder 120 may polar-encode and concatenate three pre-codewords, i.e., the first, second, and third pre-codewords $u_a$, $u_b$, and $u_c$.

Specifically, the first pre-codeword $u_a$ may be encoded into the first sub-polar codeword $C_a$ by the polar encoding matrix G, and the second pre-codeword $u_b$ may be encoded into the second sub-polar codeword $C_b$ by the polar encoding matrix G. Similarly, the third pre-codeword $u_c$ may be encoded into a third sub-polar codeword $C_c$ by the polar encoding matrix G.

The first, second, and third sub-polar codewords $C_a$, $C_b$, and $C_c$ may be concatenated to one another and may thus form the polar codeword c.

The decoder 130 may decode the first, second, and third sub-polar codewords $C_a$, $C_b$, and $C_c$ first.

If the decoding of all the first, second, and third sub-polar codewords $C_a$, $C_b$, and $C_c$ succeeds, the decoding of the polar codeword c may be finished. Also, if the decoding of all the first, second, and third sub-polar codewords $C_a$, $C_b$, and $C_c$ fails, the decoding of the polar codeword c may be finished.

On the other hand, if the decoding of only one of the first, second, and third sub-polar codewords $C_a$, $C_b$, and $C_c$ succeeds and the decoding of the other two sub-polar codewords fails, the sixth data bits $D_6$ may be disclosed as shared bits.

The decoder 130 may decode again the two sub-polar codewords that fail to be decoded using the sixth data bits $D_6$. In this case, the probability of decoding can be improved because the sixth data bits $D_6$ are frozen bits, i.e., bits that are already known to the decoder 130.

Then, if the decoding of one of the two sub-polar codewords that fail to be decoded succeeds and the decoding of the other sub-polar codeword still fails, one of the sets of the second data bits $D_2$, the fifth data bits $D_5$, and the first parity bits $P_1$ may be restored using the other two sets, and the decoder 130 may decode yet again the sub-polar codeword that still fails to be decoded. Since one of the sets of the second data bits $D_2$, the fifth data bits $D_5$, and the first parity bits $P_1$ and the sixth data bits $D_6$ are already disclosed and can thus be used as frozen bits, the probability of decoding can be further improved.

FIG. 13 illustrates an example in which unfrozen bits are divided into three regions so as for decoding to be performed in two stages using shared bits, but the present disclosure is not limited thereto. That is, the polar code decoding apparatus according to some exemplary embodiments of the present disclosure can encode and decode a pre-codeword having unfrozen bits that are divided into four or more regions.

The polar code decoding apparatus according to the exemplary embodiment of FIG. 13 can increase the ratio of the second data bits $D_2$ and the fifth data bits $D_5$, which differ from the second data bits $D_2$, i.e., the ratio of unshared data bits, using the first parity bits $P_1$. Even if the decoding of only one of the first, second, and third pre-codewords $u_a$, $u_b$, and $u_c$ succeeds, the polar code decoding apparatus according to the exemplary embodiment of FIG. 13 can increase the probability of decoding the other two pre-codewords by using the sixth data bits $D_6$.

Encoding and decoding methods of the polar code decoding apparatus according to some exemplary embodiments of the present disclosure will hereinafter be described with reference to FIGS. 1 and 14, and descriptions of elements and reference numerals that have already been described above with reference to FIGS. 1 through 13 will be omitted or at least simplified.

Figure 14:
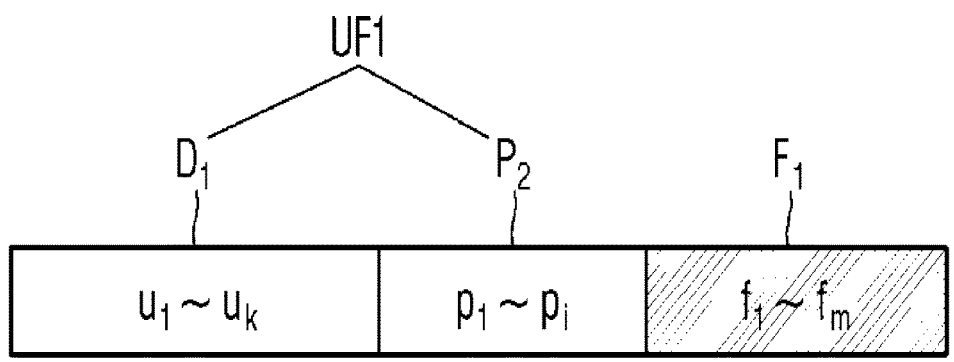
FIG. 14 illustrates the data structure of a pre-codeword for use in the polar code decoding apparatus according to some exemplary embodiments of the present disclosure.

FIG. 14 illustrates the data structure of a pre-codeword for use in the polar code decoding apparatus according to some exemplary embodiments of the present disclosure.

Referring to FIGS. 1 and 14, the first pre-codeword $u_a$ may include the first unfrozen bits UF1 and the first frozen bits $F_1$. The first unfrozen bits UF1 may include the first data bits $D_1$ and the second parity bits $P_2$. Generally, the first data bits $D_1$ may be information bits (unrelated to any previous encoding operation).

The first data bits $D_1$ may include shared bits. The shared bits may be bits shared with other pre-codewords.

The second parity bits $P_2$ may be parity bits for the first data bits $D_1$. The second parity bits $P_2$ may be cyclic redundancy check (CRC) bits.

The first data bits $D_1$ may not be shared with other pre-codewords, and the second parity bits $P_2$ may be bits shared with other pre-codewords. The second parity bits $P_2$ does not have a CRC function for other pre-codewords, but may be able to apply a CRC function to the first pre-codeword $u_a$.

The polar code decoding apparatus according to the exemplary embodiment of FIG. 14 can considerably improve decoding complexity and decoding latency using polar codes with an excellent correction capability and can perform CRC on data.

Figure 15:
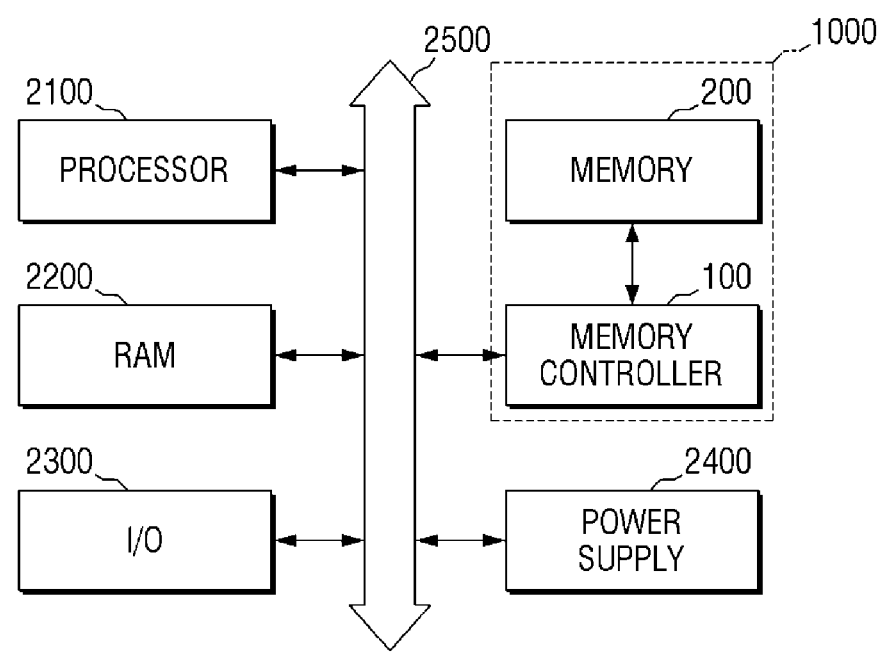
FIG. 15 is a block diagram of an electronic device in which the polar code decoding apparatus according to some exemplary embodiments of the present disclosure is employed.

FIG. 15 is a block diagram of an electronic device in which the polar code decoding apparatus according to some exemplary embodiments of the present disclosure is employed.

Referring to FIG. 15, an electronic device 2000 may include a processor 2100, a RAM 2200, an input/output (I/O) device 2300, a power supply device 2400, and a memory system 1000. Although not specifically illustrated, the electronic device 2000 may further include ports for communicating with a video card, a sound card, a memory card, a USB device, or other electronic devices. The electronic device 2000 may be implemented as a portable electronic device such as a personal computer (PC), a notebook computer, a mobile phone, a personal digital assistant (PDA), or a camera.

The polar code decoding apparatus according to some exemplary embodiments of the present disclosure, described above with reference to FIGS. 1 through 14, may be applied to the memory system 1000. Thus, the memory system 1000 may perform polar code decoding on data read from a memory device 200.

The processor 2100 may perform particular computations or tasks. In some exemplary embodiments, the processor 2100 may be a micro-processor or a central processing unit (CPU). The processor 2100 may communicate with the RAM 2200, the input/output device 2300, and the memory system 1000 via a bus 2500 such as an address bus, a control bus, or a data bus. In some exemplary embodiments, the processor 2100 may be connected not only to the bus 2500, but also to an expansion bus such as a peripheral component interconnect (PCI) bus.

The RAM 2200 may store data necessary for the operation of the electronic device 2000. For example, the RAM 2200 may be implemented as a DRAM, a mobile DRAM, an SRAM, a PRAM, an FRAM, a resistive RAM (RRAM), and/or an MRAM.

The I/O device 2300 may include input means such as a keyboard, a keypad, or a mouse and output means such as a printer or a display. The power supply device 2400 may supply an operating voltage necessary for the operation of the electronic device 2000.

A polar code decoding method according to some exemplary embodiments of the present disclosure will hereinafter be described with reference to FIGS. 8 through 16, and descriptions of elements and reference numerals that have already been described above with reference to FIGS. 1 through 15 will be omitted or at least simplified.

Figure 16:
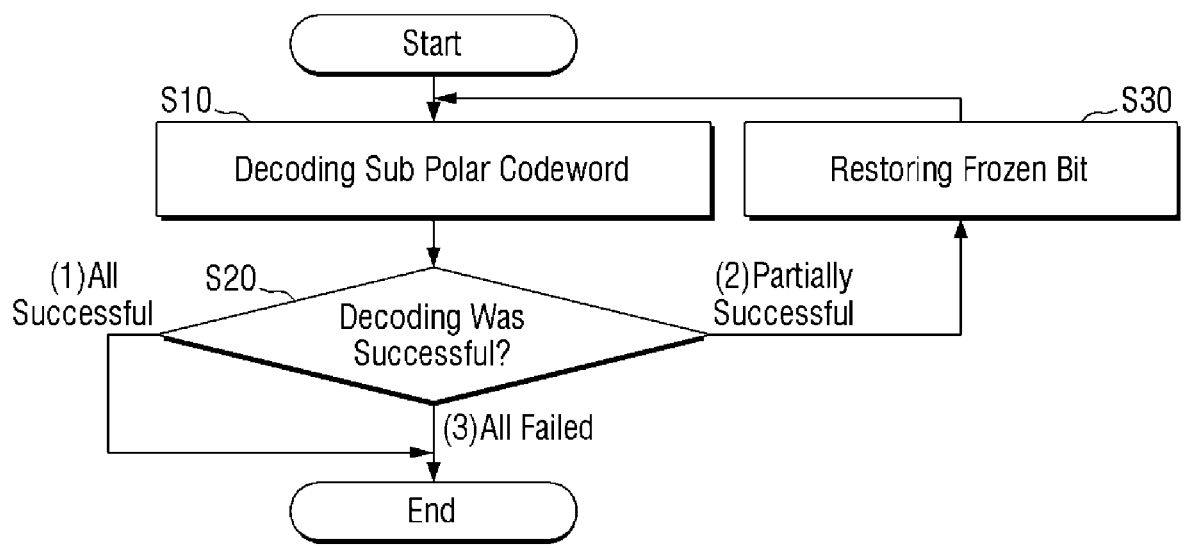
FIG. 16 is a flowchart illustrating a polar code decoding method according to some exemplary embodiments of the present disclosure.

FIG. 16 is a flowchart illustrating a polar code decoding method according to some exemplary embodiments of the present disclosure.

Referring to FIG. 16, sub-polar codewords are decoded (S10).

Specifically, referring to FIG. 8, the decoding of the first sub-polar codeword $C_a$, the decoding of the second sub-polar codeword $C_b$, and the decoding of the third sub-polar codeword $C_c$ may be performed, thereby attempting to acquire the first, second, and third pre-codewords $u_a$, $u_b$, and $u_c$. The decoding of the first sub-polar codeword $C_a$ and the decoding of the second sub-polar codeword $C_b$ may be performed one after another or at the same time. The decoding of the first sub-polar codeword $C_a$ and the decoding of the second sub-polar codeword $C_b$ may be performed independently of each other.

The success probability of decoding varies depending on the quality of each channel and varies from one sub-polar codeword to another sub-polar codeword.

Referring again to FIG. 16, a determination is made as to whether the decoding of all the sub-polar codewords has succeeded (S20).

(1) If all the sub-polar codewords are successfully decoded, the polar code decoding method according to some exemplary embodiments of the present disclosure ends.

(2) If only some of the sub-polar codewords are successfully decoded, the polar code decoding method according to some exemplary embodiments of the present disclosure proceeds to S30.

(3) If the decoding of all the sub-polar codewords has failed, the polar code decoding method according to some exemplary embodiments of the present disclosure ends.

In S30, frozen bits are restored.

Specifically, referring to FIG. 8, the second data bits $D_2$ may be included in both the first and second pre-codewords $u_a$ and $u_b$. That is, the second data bits $D_2$ may serve as shared bits between the first and second pre-codewords $u_a$ and $u_b$.

If the decoding of the first sub-polar codeword $C_a$ fails and the decoding of the second sub-polar codeword $C_b$ succeeds, the third data bits $D_3$ and the second data bits $D_2$ of the second pre-codeword $u_b$ may be disclosed to the decoder 130 of FIG. 1. That is, the second data bits $D_2$, which are the shared bits between the first and second pre-codewords $u_a$ and $u_b$, may be disclosed.

Accordingly, the first frozen bits $F_1$ and the second data bits $D_2$ may be used as frozen bits to decode the first sub-polar codeword $C_a$. That is, since frozen bits are bits that are already known to the decoder 130, not only the first frozen bits $F_1$, which are already known from the beginning, but also the second data bits $D_2$, which are disclosed in the process of decoding the second sub-polar codeword $C_b$, may be used as frozen bits to decode the first data bits $D_1$, which are yet to be disclosed.

At this time, the ratio of frozen bits is higher than at the initial stage of decoding, i.e., in S10, and thus, the success probability of decoding may also be higher than in S10. As a result, the decoding of the first sub-polar codeword $C_a$ may be performed with an increased success probability of decoding.

On the other hand, if the decoding of the second sub-polar codeword $C_b$ fails and the decoding of the first sub-polar codeword $C_a$ succeeds, the first data bits $D_1$ and the second data bits $D_2$ of the first pre-codeword $u_a$ may be disclosed to the decoder 130 of FIG. 1. That is, the second data bits $D_2$, which are the shared bits between the first and second pre-codewords $u_a$ and $u_b$, may be disclosed.

Accordingly, the second frozen bits $F_2$ and the second data bits $D_2$ may be used as frozen bits to decode the second sub-polar codeword $C_b$. That is, since frozen bits are bits that are already known to the decoder 130, not only the second frozen bits $F_2$, which are already known from the beginning, but also the second data bits $D_2$, which are disclosed in the process of decoding the first sub-polar codeword $C_a$, may be used as frozen bits to decode the second data bits $D_2$, which are yet to be disclosed.

As a result, the decoding of the second sub-polar codeword $C_b$ may be performed with an increased success probability of decoding.

The polar code decoding apparatus and method according to some exemplary embodiments of the present disclosure use polar codes that are complicated and time-consuming to be decoded, but can considerably reduce decoding complexity and decoding latency. Also, when overall decoding is impossible, the polar code decoding apparatus and method according to some exemplary embodiments of the present disclosure can perform partial error correction through partial decoding.

Another polar code decoding method according to some exemplary embodiments of the present disclosure will hereinafter be described with reference to FIGS. 8, 16, 17, and 18, and descriptions of elements and reference numerals that have already been described above with reference to FIGS. 1 through 16 will be omitted or at least simplified.

Figure 17:
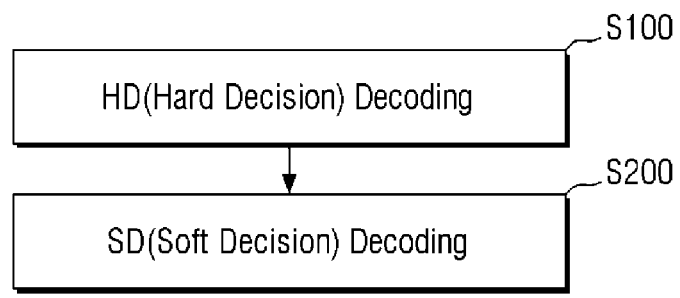
FIG. 17 is a flowchart illustrating another polar code decoding method according to some exemplary embodiments of the present disclosure.
Figure 18:
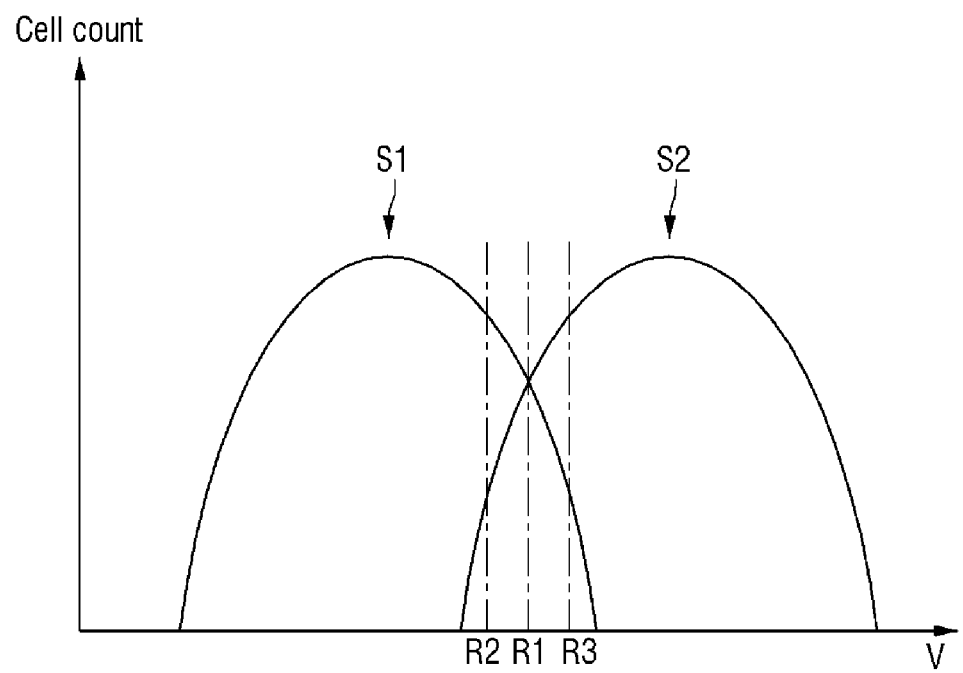
FIG. 18 is a graph for explaining hard decision (HD) decoding and soft decision (SD) decoding as performed in the polar code decoding method according to the exemplary embodiment of FIG. 17.

FIG. 17 is a flowchart illustrating another polar code decoding method according to some exemplary embodiments of the present disclosure, and FIG. 18 is a graph for explaining hard decision (HD) decoding and soft decision (SD) decoding as performed in the polar code decoding method according to the exemplary embodiment of FIG. 17.

Referring to FIG. 17, HD decoding is performed (S100).

Specifically, referring to FIGS. 2 and 18, the flash memory chips 201 and 203 may have different cell counts (i.e., scattering characteristics) for different voltages.

The scattering characteristics may have multiple states S1 and S2. A determination can be made as to whether the flash memory chips 201 and 203 are in the state S1 or in the state S2 by a single read operation performed at a first read level R1, and this may be defined as HD decoding. HD decoding can perform a read operation at a relatively high speed, but has a relatively low precision for determining the state of the flash memory chips 201 and 203.

HD decoding may be the same as the polar code decoding method described above with reference to FIGS. 8 and 16. HD decoding is relatively fast, but is likely to fail because of its relatively low precision.

Referring again to FIG. 17, if HD decoding fails, SD decoding is performed (S200).

SD decoding can determine the state of the flash memory chips 201 and 203 at a second read level R2, which is adjacent to the first read level R1, and/or a third read level R3, which is adjacent to the second read level R2, by performing an additional read operation at the first read level R1. SD decoding may be relatively slow but may have a relatively high precision for determining the state of the flash memory chips 201 and 203.

SD decoding may be the same as the polar code decoding method described above with reference to FIGS. 8 and 16.

In the exemplary embodiment of FIG. 17, HD decoding is primarily performed at high speed, and only when HD decoding fails, SD decoding is additionally performed. Thus, decoding can be performed at high speed, and even if decoding fails, additional decoding can be performed later.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A polar code encoding and decoding method comprising:
    generating a first sub-codeword by polar-encoding a first pre-codeword, the first pre-codeword including first unfrozen bits and first frozen bits, wherein the first unfrozen bits include first data bits and second data bits;
    generating a second sub-codeword by polar-encoding a second pre-codeword, the second pre-codeword including second unfrozen bits and second frozen bits, wherein the second unfrozen bits include third data bits and the second data bits;
    decoding the first sub-codeword;
    decoding the second sub-codeword without reference to the decoding the first sub-codeword; and
    only if the decoding of the first sub-codeword is successful and the decoding of the second sub-codeword without reference to the decoding the first sub-codeword is not successful, decoding the second sub-codeword a second time, using the second data bits recovered from the decoding of the first sub-codeword.

2. The polar code encoding and decoding method of claim 1, further comprising:
    generating a third sub-codeword by polar-encoding third data, the third data including third unfrozen bits and third frozen bits, wherein the third unfrozen bits include fourth data bits and the second data bits;
    decoding the third sub-codeword; and
    when the decoding of the first sub-codeword is successful and the decoding of the second sub-codeword is not successful, if the decoding the third sub-codeword is not successful, decoding the third sub-codeword for a second time, using the second data bits.

3. The polar code encoding and decoding method of claim 2, wherein the second data bits are parity bits.

4. The polar code encoding and decoding method of claim 2, wherein the second data bits are information bits.

5. The polar code encoding and decoding method of claim 1, wherein the first unfrozen bits include a data region and a parity region, and wherein the parity region includes parity information of the data region.

6. The polar code encoding and decoding method of claim 1, further comprising:
    primary decoding, which includes the decoding the first sub-codeword and the decoding the second sub-codeword and the decoding the second sub-codeword a second time, using the second data bits; and
    secondary decoding performed after the primary decoding,
    wherein the primary decoding is based on a hard decision decoding, and the secondary decoding is based on a soft decision decoding.

7. A polar code encoding and decoding method comprising:
    generating a first sub-codeword by polar-encoding a first pre-codeword, the first pre-codeword including first unfrozen bits and first frozen bits, wherein the first unfrozen bits include first data bits and second data bits;
    generating a second sub-codeword by polar-encoding a second pre-codeword, the second pre-codeword including second unfrozen bits and second frozen bits, wherein the second unfrozen bits include third data bits and fourth data bits, wherein the fourth data bits are related to the second data bits;

decoding the first sub-codeword;

decoding the second sub-codeword without reference to the decoding the first sub-codeword;

only if the decoding of the first sub-codeword is successful and the decoding of the second sub-codeword without reference to the decoding the first sub-codeword is not successful, decoding the second sub-codeword a second time, using the second data bits; and only if the decoding of the second sub-codeword without reference to the decoding the first sub-codeword is successful and the decoding of the first sub-codeword is not successful, decoding the first sub-codeword a second time, wherein the decoding the first sub-codeword a second time comprises using the fourth data bits.

8. The polar code encoding and decoding method of claim 7, wherein the fourth data bits are the same as the second data bits.

9. The polar code encoding and decoding method of claim 8, further comprising:

generating a third sub-codeword by polar-encoding a third pre-codeword, the third pre-codeword including third unfrozen bits and third frozen bits, wherein the third unfrozen bits include fifth data bits and the second data bits;

decoding the third sub-codeword; and if the decoding of the third sub-codeword is successful and the decoding of the second sub-codeword without reference to the decoding the first sub-codeword is not successful and the decoding of the first sub-codeword is not successful:

decoding the first sub-codeword a second time, using the second data bits, and decoding the second sub-codeword a second time, using the second data bits.

10. The polar code encoding and decoding method of claim 7, further comprising:

generating a third sub-codeword by polar-encoding a third pre-codeword, the third pre-codeword including third unfrozen bits and frozen bits, wherein the third unfrozen bits include fifth data bits and the fourth data bits, wherein the fourth data bits include first parity bits of the second data bits and second parity bits of the fifth data bits;

decoding the third sub-codeword, wherein, if the decoding of the second sub-codeword without reference to the decoding the first sub-codeword is successful and the decoding of the first sub-codeword is not successful, the decoding the first sub-codeword a second time further comprises using the fifth data bits.

11. The polar code encoding and decoding method of claim 10, wherein the decoding the first sub-codeword a second time further comprises restoring the second data bits using the fourth data bits and the fifth data bits and decoding the first sub-codeword using the restored second data bits as frozen bits.

12. The polar code encoding and decoding method of claim 10, further comprising:

if the decoding of the first sub-codeword is successful and the decoding of the second sub-codeword without reference to the decoding the first sub-codeword is successful and the decoding of the third sub-codeword is not successful:

decoding the third sub-codeword a second time, using the second data bits and the fourth data bits.

13. The polar code encoding and decoding method of claim 10, further comprising:

if the decoding of the first sub-codeword is successful and the decoding of the third sub-codeword is successful and the decoding of the second sub-codeword without reference to the decoding the first sub-codeword is not successful, decoding the second sub-codeword a second time, using the second data bits and the fifth data bits.

14. The polar code encoding and decoding method of claim 10, wherein the first unfrozen bits, the second unfrozen bits, and the third unfrozen bits form a first plurality of bits, and the first plurality of bits comprises sixth data bits, seventh data bits, eighth data bits, and ninth data bits, and wherein the sixth data bits, the seventh data bits, the eighth data bits, and the ninth data bits are not independent in a statistical sense, wherein the polar code encoding and decoding method further comprises, if the decoding of at least one of the first sub-codeword, the second sub-codeword without reference to the decoding the first sub-codeword and the third sub-codeword is successful, and if the decoding of one of the first sub-codeword, the second sub-codeword without reference to the decoding the first sub-codeword and the third sub-codeword is not successful, decoding a sub-codeword that failed to decode a second time, using at least one of the sixth data bits, the seventh data bits, the eighth data bits, and the ninth data bits.

15. A polar code encoding and decoding method comprising:

generating a first plurality of sub-codewords by polar-encoding a second plurality of pre-codewords, wherein the second plurality of pre-codewords includes a first pre-codeword and a second pre-codeword, wherein each pre-codeword of the second plurality of pre-codewords includes frozen bits and unfrozen bits, wherein at least the first pre-codeword and the second pre-codeword include shared bits:

performing primary decoding of the first plurality of sub-codewords; and performing secondary decoding, using the shared bits, of a first sub-codeword only when the performing primary decoding fails with respect to the first sub-codeword.

16. The polar code encoding and decoding method of claim 15, wherein the shared bits are all the same.

17. The polar code encoding and decoding method of claim 15, wherein the second plurality of pre-codewords includes a third pre-codeword, wherein the shared bits of the first pre-codeword are different from the shared bits of the second pre-codeword, and wherein the shared bits of the third pre-codeword comprises first parity bits of the shared bits of the first pre-codeword and second parity bits of the shared bits of the second pre-codeword.

18. The polar code encoding and decoding method of claim 15, wherein the unfrozen bits include a data region and a parity region, wherein the parity region includes parity information of the data region.

19. The polar code encoding and decoding method of claim 15, wherein the unfrozen bits and the frozen bits are interleaved.

20. The polar code encoding and decoding method of claim 15, wherein the primary decoding and the secondary decoding are hard decision decoding, wherein a tertiary decoding is soft decision decoding, and
wherein the polar code encoding and decoding method further comprises performing tertiary decoding, after the secondary decoding, on at least one sub-codeword that fails to be decoded by the secondary decoding.

\* \* \* \* \*